Sept. 12, 1967 D. J. GARIBOTTI 3,340,601

ALLOY DIFFUSED TRANSISTOR

Filed July 17, 1963

Preheat — LASER or defocused EB

INVENTOR
DOMENICK J. GARIBOTTI
BY [signature]
ATTORNEY

United States Patent Office 3,340,601
Patented Sept. 12, 1967

3,340,601

ALLOY DIFFUSED TRANSISTOR

Domenick J. Garibotti, Longmeadow, Mass., assignor to United Aircraft Corporation, East Hartford, Conn., a corporation of Delaware Filed July 17, 1963, Ser. No. 295,635
4 Claims. (Cl. 29—582)

This invention relates to transistors, semiconductor circuits, diodes, and related semiconductor devices. More particularly, this invention is directed to the fabrication of alloy-diffused junction semiconductor devices.

In the fabrication of semiconductor devices, and particularly in the fabrication of digital and analog circuits of the semiconductor integrated circuit type, present solid state technology employs planar techniques. These techniques, through controlled oxide masking coupled with vapor and vacuum deposition processes followed by thermal treatments, permit fabrication of active as well as passive devices in a body of semiconductive material. In the utilization of these known planar techniques, the accurate delineation or demarcation of the diffusion fronts of the impurities added to the host material to form the junction areas and passive devices depends primarily on the surface smoothness of the base material, its crystalline perfection, and upon the definition of the etched oxide masks which are required for the impurity build-up and diffusions necessary to fabricate a device. Since it is very difficult to obtain oxide masking strips of uniform width and further since the impurities have a tendency to penetrate underneath the oxide mask, the possibility of obtaining, in the fabrication of three element devices by these techniques, a base region of uniform width is greatly limited. The operating characteristics of a junction device are affected by the width of the base area and thus quality control to produce uniform yield is exceedingly difficult. In order to obtain junction devices having the same operational characteristics, the yield using the known planar techniques is very low. Consequently, in the prior art, optimized performance is usually sacrificed for yield by making the base region relatively thick and the base area small. Also, as a result of the above described inherent deficiencies in the planar techniques, it has been impossible to produce junction devices that will safely handle significant amounts of power. This is due to the fact that the resultant base areas, when the planar techniques are employed, are necessarily small in order to insure high yield. Further more, fabrication of semiconductor circuits on one chip of host material requires isolation diffusions, for the purpose of forming blocking diodes, between the active elements. This additional diffusion treatment is extremely time consuming and in addition may result in the diffusion of an unwanted impurity into the host material because of pin holes or other defects in the oxide mask. These defects may originate during the oxidation treatment or during the photo-engraving-etching process. The extremely long time needed to form these blocking diodes results from the fact that the impurity must be diffused completely through the chip of host material.

In the present planar techniques, each extremely time consuming diffusion step must add enough impurity to over-compensate for the amount of impurity of opposite type already contained in the host material. That is, if the first diffusion added a p-type impurity to a chip of n-type semiconductor material, then the second diffusion must add more than enough n-type impurity to compensate for the previous p-type addition in order to form an emitter region rich in n-type impurity within the p-type impurity region formed by the first diffusion step. Obviously, the amount of p-type impurity initially added must have been sufficient to overcompensate for the n-type impurity in the chip. Consequently, because of these overcompensation diffusions, the purity of the host semiconductor material is degraded and, due to the high concentration of impurity atoms, approaches degeneracy.

Semiconductor devices and circuits fabricated by the prior art planar techniques also suffered from relatively high collector and emitter series resistances. That is, in the past there has been a relatively high resistance between the junctions and the collector and emitter contact areas. This situation is particularly troublesome in semiconductor circuits since the collector contact area is usually on the surface of the chip of host material.

This invention overcomes the above discussed deficiencies of the prior art by providing a novel method for the fabrication of semiconductor junction devices.

It is therefore an object of this invention to provide improved semiconductor devices.

It is also an object of this invention to provide semiconductor devices capable of handling relatively large amounts of power.

It is another object of this invention to provide a novel method of fabricating alloy-diffused junction semiconductor devices.

It is still another object of this invention to improve the uniformity of semiconductor junction devices.

It is yet another object of this invention to significantly reduce the number of steps required to produce semiconductor devices and circuits.

It is also an object of this invention to significantly increase the speed at which semiconductor devices and circuits may be fabricated.

It is a further object of this invention to provide a process for the fabrication of junction devices having a greater yield of usable devices than previously obtainable.

It is another object of this invention to produce semiconductor devices and circuits with less expense than previously possible.

It is also an object of this invention to provide a process for the fabrication of junction devices having much flexibility.

It is still a further object of this invention to provide semiconductor devices which have a very low emitter and collector series resistance.

It is further an object of this invention to provide an active semiconductor device having its leads welded directly to the active areas.

These and other objects of this invention are achieved by a "spiked" topological inversion technique. In a preferred embodiment, this technique employs an intense beam of charged particles to simulate a plurality of welds to a desired depth in a chip of host semiconductor material. Impurities of the proper conductive type are added to the simulated weld regions and subsequently are caused to diffuse from such regions thereby forming narrow base regions of uniform width between successive junctions. Due to the extremely exact control which can be effected on a beam of charged particles by means known in the art, a high yield of uniform quality devices may be realized by this charged particle beam activated topological inversion technique.

This invention may be better understood and its numerous advantages will become apparent to those skilled in the art by reference to the accompanying drawing wherein like reference numerals refer to like elements in the various figures and in which.

As mentioned above, the present approach to the fabrication of junction devices, particularly as a part of a semiconductor integrated circuit, employs planar techniques. These techniques essentially consist of the successive growing of oxide layers followed by masking, photoetching and gas plating of the impurity atom, and thermal treatments to promote diffusion of the impurity. Thus, by these techniques, devices such as transistors will be the end result of a relatively large number of repetitious steps including at least two lengthy thermal treatments in a diffusion furnace. As can be well imagined, the greater the number of steps required the greater is the chance of unwanted impurities contaminating the host semiconductor material. For a more complete description of these planar techniques, reference is made to U.S. Patent No. 3,178,804, by Lee R. Ullery, Jr., and myself, and particularly to the description of FIGURES 1 through 10 thereof. Of further interest in this area is the article "Epitaxial Techniques in Semiconductor Devices" by Sigler and Watelski, published on pages 33–37 of the March 1961 issue of the Solid State Journal.

In order to overcome the problems mentioned above inherent in the prior art planar techniques, it has been suggested that topological inversion be employed to produce semiconductor devices. Theoretically, the use of topological inversion as applied to the prior art masking and etching techniques would permit the fabrication of junction devices having large base area regions of the desired width. However, in practice, it is difficult to obtain, by these etching techniques, sufficiently narrow masking strips of uniform width. Furthermore, as mentioned above, the impurity atoms have a tendency to diffuse underneath the masking strips, which conventionally are silicon oxide, and to penetrate into the host material in regions which would otherwise form the base areas. Consequently, it is extremely difficult to obtain base areas of uniform width without these areas being shorted across.

Figure 1:
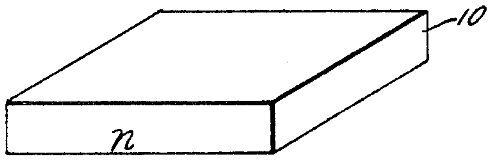
FIGURE 1 depicts a chip of host semiconductor material in which the junction device or devices produced in accordance with this invention will be formed.

Referring now to the drawing, a technique which eliminates all of the above problems will be explained. In FIGURE 1 there is depicted a chip of n-type silicon which is to be used as the host material in the formation or fabrication of an alloy-diffused junction transistor of the pnp-type. It must be noted that the fabrication of a transistor will be discussed herein for purposes of explanation only and that the techniques to be described are equally applicable to the fabrication of diodes and integrated or hybrid semiconductor circuitry. Also, the description of the instant invention will be directed to the formation of a single transistor in the chip of host material 10 of FIGURE 1 while, in actual practice, a great number of transistors or diodes would ordinarily be formed in a single chip of host material which would then be diced to separate the individual active devices. Further, while the description of this invention will be centered about silicon as the host semiconductor material, the disclosed technique is not restricted to silicon but is also applicable to germanium and gallium arsenide as well as compounds of the II–VI and III–V variety. The latter feature is particularly significant when it is remembered that the oxide masking necessary for the present planar techniques can be employed only with silicon.

Figure 2:
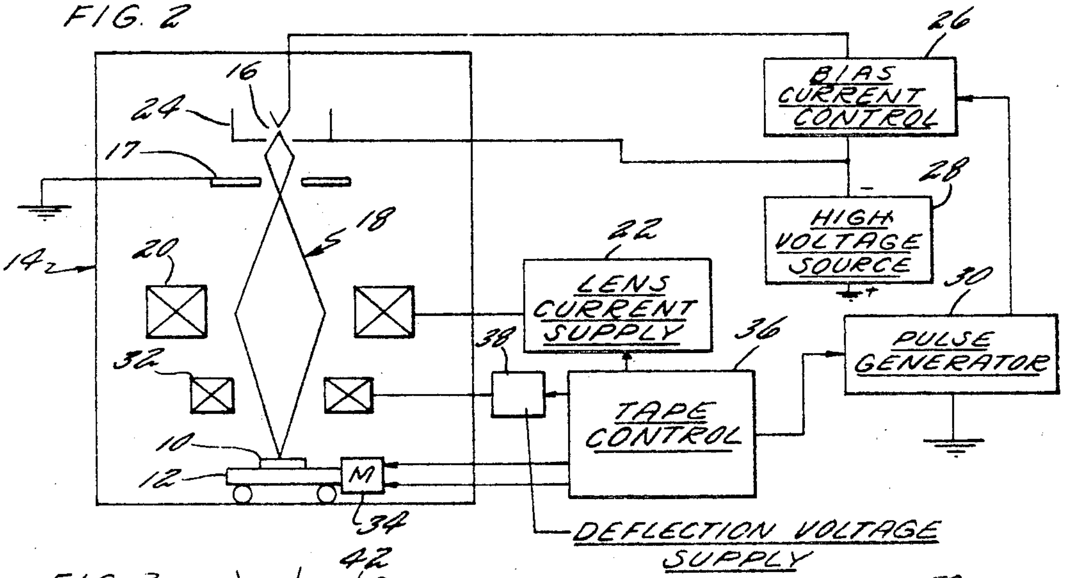
FIGURE 2 is a schematic representation of an electron beam welding machine with the chip of semiconductor material of FIGURE 1 properly positioned therein for the fabrication of junction devices in accordance with this invention.

In FIGURE 2, the chip of host semiconductor material 10 is depicted as being located on a movable work table 12 in the vacuum chamber of an apparatus which generates an intense beam of electrons. As will be explained more fully below, there are a number of advantages inherent in the use of an electron beam as a tool for working semiconductor materials. In order to obtain these advantages, the electron beam generator utilized must be a precision instrument capable of providing a highly focussed electron beam. U.S. Patent No. 2,987,610, issued June 6, 1961, to K. H. Steigerwald, discloses such an electron beam machine. Apparatus such as that shown in the Steigerwald patent, as a result of recently developed refinements in electron optics, can provide a beam focussed to produce power densities on the order of 10 billion watts per square inch. Such beams may be focussed so as to have diameters in the micron range at the point of impingement on the work. As is now well known, electron beam machines are devices which use the kinetic energy of an electron beam to work a material. An electron beam is a tool which has practically no mass but has high kinetic energy because of the extremely high velocity imparted to the electrons. Transfer of this kinetic energy to the lattice electrons of the workpiece generates higher lattice vibrations which cause an increase in temperature within the impingement area sufficient to accomplish work. The physical phenomenon described in the above-mentioned Steigerwald patent, wherein deep penetration of the electrons into the target material is achieved, is not fully understood. However, it may be stated that electron beam welding results from an electron penetration rather than a thermal conduction phenomenon. Deep penetration of a highly focussed electron beam results, as shown in the Steigerwald patent, in a narrow fusion zone or weld having a high depth to width ratio. The depth of penetration depends upon the beam power density, the rate at which the beam is deflected across the surface of the workpiece or target, and the characteristics of the material being operated upon by the beam. Thus, by selection and then proper adjustment of the D.C. acceleration voltage applied between the cathode and apertured anode of the electron beam generator, which voltage accelerates the beam of electrons towards the workpiece; the bias voltage applied between the cathode and a control electrode positioned between the cathode and anode, which voltage controls the number of electrons in the beam; the current to a magnetic lens which focusses the beam to the desired spot size; and the rate of relative movement between the workpiece and the beam; the beam power density and thus the depth of penetration of the electrons can be selected and accurately adjusted.

As mentioned above, there are a number of inherent advantages in using the electron beam as a tool to work materials. The extremely narrow fusion zone that can be produced with an intense electron beam is just one of these advantages. A second advantage resides in the fact that the electron beam as a tool can be easily controlled since it may be readily focussed, its power simply adjusted and it may be precisely deflected electrically to any desired point. Thus, fusion zones of the desired shape located in the desired spatial relation to each other may be produced with an electron beam within extremely small tolerances. Also, a beam of electrons is extremely pure in the chemical sense in that it contains no contaminants and, since working with an electron beam is usually performed in a vacuum, the possibility of unwanted contamination of the semiconductor material being worked is virtually eliminated. Referring now again to FIGURE 2, an electron beam machine is shown generally as 14. In machine 14 electrons are emitted by a directly heated cathode 16 which is connected to a source of heating current, not shown. The electrons emitted by cathode 16 are caused to be accelerated toward the workpiece by a negative D.C. acceleration voltage which is applied between cathode 16 and a grounded apertured anode 17. The accelerated electrons are focussed into a beam 18 by means clearly shown and described in the above-mentioned Steigerwald patent. The electron beam 18 is focussed to provide the desired beam diameter or spot size at the workpiece by varying the current applied to magnetic lens assembly 20 from a lens current supply 22. Initially, beam 18 may be either gated off by a blocking voltage applied between the cathode 16 and a control electrode 24 by a bias voltage control 26 or a defocussed beam may be caused to impinge upon the workpiece. Bias control 26 may be of the type disclosed in U.S. Patent No. 3,177,434, by J. A. Hansen and assigned to the same assignee as this invention. A pulse generator 30 is provided to supply to cathode 16, through bias voltage control 26, negative pulses which will overcome the blocking bias on control electrode 24. The magnitude of the pulses supplied by pulse generator 30 is controllable, in a manner well known in the art, so as to allow the operator to adjust the beam current or number of electrons permitted to pass the control electrode to the desired value. Beam 18 may be caused to trace a desired pattern on the workpiece, which in this case is chip 10, varying the current to magnetic deflection coils 32, by causing motor 34 to drive movable table 12 in the desired direction, or by a combination of beam deflection and table movement. Both the beam deflection and the movement of table 12 may be programmed by means, well known in the art, such as magnetic tape control 36. Tape control 36 may also be utilized to control the duration and magnitude of the pulses supplied by pulse generator 30 and to control the focus of the beam by controlling lens current supply 22.

Figure 3:
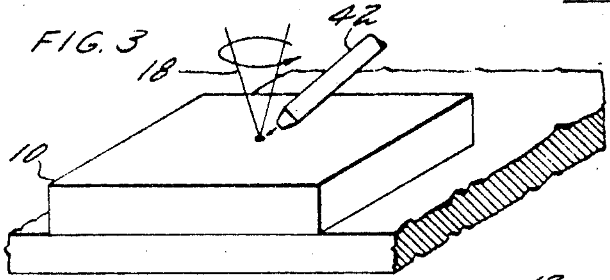
FIGURES 3 through 7 illustrate various steps, or the result thereof, performed in the practice of this invention.
Figure 4:
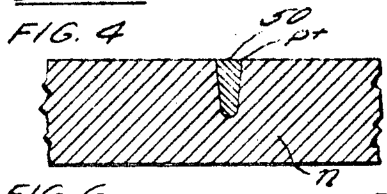

The usual first step in fabricating a junction device in accordance with this invention, after the chip has been properly positioned in the electron beam machine's work chamber, is to cause preheating of the chip. While it may be desirable to preheat the semiconductor material being worked to minimize thermal shock of these normally brittle materials, it should be understood that such preheating is not mandatory. That is, by the proper selection of the electron beam parameters, preheating may be obviated. When employed, preheating is utilized to heat the chip up to the plastic range of the particular semiconductor material being worked to protect against microcracks. The latter may be caused as a result of thermal shocks. Preheating may be accomplished by use of an auxiliary source of thermal energy located either in or outside of the work chamber of the electron beam machine. For example, chip 10 may be preheated by directing the beam from a LASER through a glass port in the side of the evacuated work chamber. It has been found to be preferable to heat the chip 10 with such an auxiliary source prior to and during the electron beam impingement. Preheating of the chip can also be accomplished with the above mentioned initially defocussed electron beam. Such a defocussed low intensity electron beam will supply thermal energy to the silicon without causing fusion or otherwise damaging the chip. To preheat in this manner, the bias voltage control is adjusted by the operator to provide a very low beam current and lens current supply 22, under the authority of tape control 36, will supply insufficient current to magnetic lens 20 to cause precise focussing of beam 18. After chip 10 has been preheated, either with a defocussed electron beam or with an auxiliary source of thermal energy, the step depicted in FIGURE 3 is performed. Tape control 36 is activated by the operator and commands that the beam be brought into focus and simultaneously orders pulse generator 30 to produce a control voltage pulse which, when applied to cathode 16, will cause a beam current that, for the selected spot size and acceleration voltage, will provide a beam power density sufficient to produce the desired depth of penetration of beam 18 into chip 10. As shown in FIGURE 3, the focussed beam, under the direction of tape control 36 through deflection current supply 38 or table motor 34, is caused to trace a desired path thereby producing a simulated weld. In the example to be described, beam 18 follows a circular path so that the first simulated weld is a round spot in the center of chip 10. While the beam is impinging upon the n-type silicon of chip 10, a suitable impurity is added by one of several methods. In the embodiment of FIGURE 3, the impurity is added in the form of a gas supplied from a source, not shown, down a nozzle 42 and is thus directed at the point of beam impingement on chip 10. Due to the thermal energy released at the beam impingement point, decomposition or reduction of the gaseous compound will occur and the impurities will be dissolved into the simulated weld region. In the exemple being described where silicon chip 10 is rich in an n-type impurity, nozzle 42 will supply a p-type impurity. Typical p-type impurities are diborane $B_2H_6$ (.01% $B_2H_6$ in $H_2$), $BCl_3$ or methyl borate. In the case where the chip of semiconductor material is rich in a p-type impurity, n-type impurities would be supplied through nozzle 42. Typical n-type impurities are phosphine $PH_3$ (.01% $PH_3$ in $H_2$), $PCl_5$, $POCl_3$, or phosphorus pentoxide in nitrogen ($P_2O_5+N_2$). Since the nozzle is of fine diameter and relatively close to the simulated weld, the overall addition of gases to the system is very small. Consequently the vacuum is not degraded. Alternatively, the desired impurity specie may be added in solid form by shaking powder from a vibrating chute onto the beam impingement point. The operation depicted in FIGURE 3 results in the structure shown in cross section in FIGURE 4. In FIGURE 4 it can be seen that the chip of n-type silicon 10 now contains a narrow fusion zone 50 rich in a p-type impurity. In fact, fusion zone 50 will contain such a high concentration of impurity atoms; from $10^{19}$ to $10^{20}$ impurity atoms per cubic centimeter; that it will become a degenerate region. Such a degenerate enriched region may also be described as an enriched regrown zone or a regrown impurity source. Fusion zone 50 will, due to the high concentration of impurity atoms, no longer exhibit semiconductor properties and will have a low resistivity. In a typical example, chip 10 would be an n-type silicon wafer .006 inch thick. In order to achieve a fusion zone or simulated weld approximately .002 inch deep and approximately .001 inch wide, the electron beam will be pulsed as table 12 moves at a speed of 15 inches per minute. In the example being described, the beam acceleration voltage will be 130 kv., the beam current 100 microamps, the pulse length 9 microseconds, the pulsed repetition rate 1000 microseconds, and the beam spot size .0005 to .001 inch in diameter. The simulated weld described above can be accomplished with the recited electron beam machine parameters without preheating of the silicon chip. Preheating of the silicon permits equivalent penetration at reduced machine settings. For instance, with the silicon at 350° C., penetration of .0025 inch may be achieved with a beam acceleration voltage of 100 kv., beam current of 300 microamps, a pulse length of .5 millisecond, a pulse repetition rate of 1.2 milliseconds and a table speed of 5 inches per minute.

Figure 5:
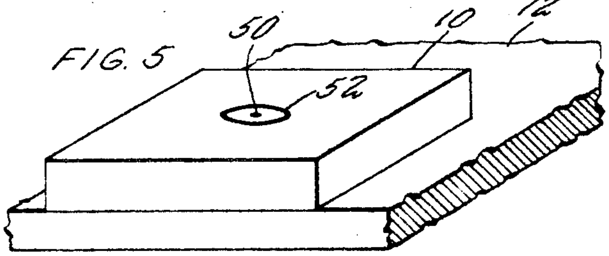
Figure 6:
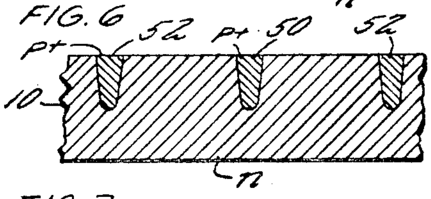

Next, the step described in relation to FIGURE 3 is repeated to form a second simulated weld region 52, shown clearly in FIGURE 5, surrounding the first region 50 and separated therefrom by an unworked region of n-type silicon. FIGURE 6 depicts a cross-sectional view of the result of this second simulated welding operation.

In the example being described, only a single transistor is being fabricated and thus further simulated welds are not necessary. The chip depicted in FIGURES 5 and 6 is now placed in a diffusion furnace at the proper temperature and for the proper amount of time to cause diffusion of the p-type impurities out of the simulated weld regions. As explained above, regions 50 and 52 are regrown impurity sources. Thus, as can be seen from FIGURE 7, the diffusion is allowed to occur until a narrow base region of n-type silicon remains. The required time and temperatures for diffusion are well known to those versed in the technology. Diffusion constants of various materials in germanium and silicon are given in the chapter "Diffusion Processes in Ge and Si" by Reiss and Fuller which appears in the book Semiconductors edited by Hannay and published by Reinhold Publishing Corporation in 1959. Referring back to FIGURE 5, it can be seen that the base area of the resulting device is large. Furthermore, the base area can be increased by the use of interdigitated geometries.

As a final step in the fabrication of a junction device in accordance with this invention, leads must be attached to the transistor or other semiconductor device in order to permit its interconnection with other circuit elements. Several approaches may be followed insofar as lead attachment is concerned. However, in all cases, a fusion bond is produced between the junction device and the emitter and collector leads. A fusion bond, which in the preferred embodiment is produced by electron beam welding, has advantages over prior art thermocompression bonding of leads in that it is stronger and more reliable, has lower resistance and is adaptable to being produced in an automated fashion. Referring again to FIGURE 7, a transistor having an emitter lead 60, a collector lead 62 and a base lead 64 has been completed by welding the leads directly to the device itself without the use of intermediate vacuum deposited terminal pads. By electron beam welding of emitter and collector leads 60 and 62 directly to the degenerate regions 50 and 52, which are relatively wide and a low resistance, contact to the active areas of the device is achieved with extremely low series resistance. The low series resistance results because the degenerate regions have from $10^{19}$ to $10^{20}$ impurity atoms per cubic centimeter while the impurity concentration in the diffusion zones, in devices produced both in accordance with this invention and by prior art planar techniques, is approximately $10^{14}$ atoms per cc. This high concentration of impurity atoms in the fusion zones greatly decreases the resistivity of these regions and, since the degenerate zones extend into the host crystal, a significant reduction in emitter and collector series resistance results. As noted above, leads were formerly attached to semiconductor devices by bonding to a terminal pad which was vacuum deposited on the surface of the active areas. This deposition step and its accompanying thermal treatment, eliminated by the instant invention, presented an additional possibility for lower yield of usable devices. Also, high frequency response of the finished devices is improved by this invention since elimination of the contact pads minimizes interelectrode capacitances.

Figure 7:
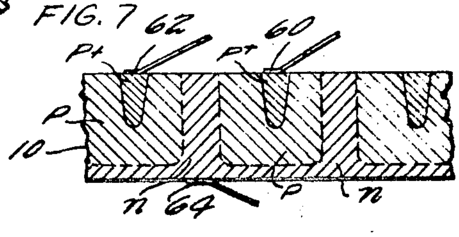

As should be obvious from FIGURE 7, not only can the base lead be welded directly to the single crystal base region at the top or bottom of chip 10, but contact to the base can also be made by bonding the chip to a header or substrate. The latter technique is used extensively in making contact to the collector areas of state of the art semiconductor integrated circuits and is accomplished by eutectically bonding the chip to the header with a gold or gold-silicon preform. Of course, the lead attachment step may be performed either before or after dicing to separate the plurality of individual devices which, in the usual case, would be formed on a single chip of semiconductor material. In a typical instance, a foil of metal is etched into a suitable lead pattern, known as a lead matrix, and the individual leads are fixed so as to be in contact with the various degenerate areas on the chip. Thereafter, the leads are rapidly and automatically welded to the degenerate areas with a programmed electron beam. It should be noted, and as will be obvious to those skilled in the art, that the leads which are electron beam welded to the semiconductor material should be high temperature materials which display expansion coefficients compatible with the semiconductor materials. For example, when chip 10 is silicon, molybdenum leads might be employed.

Figure 8:
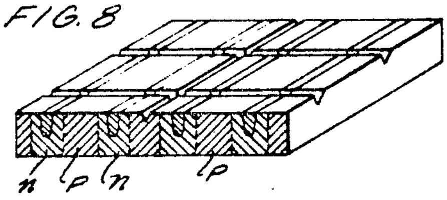
FIGURE 8 illustrates an alternative method of producing junction devices in accordance with this invention.

The invention naturally lends itself to a completely new device fabrication process not only from the standpoint of alloy diffusion formation of pn junctions and lead attachments but also insofar as separation of the devices are concerned. For example, referring now to FIGURE 8, it is possible to form a series of longitudinal degenerate n+ strips by simulated electron beam welding, accompanied by the addition of suitable n-type impurities, on a p-type chip of semiconductive material. Then, in the manner described above, the n-type impurities are caused to diffuse until the required base width is achieved. Thereafter, the beam power density of the electron beam machine can be increased and the beam caused to scribe the wafer of host material along $x$ and $y$ axes as indicated in FIGURE 8. As an alternate approach, scribing may be done after the simulated welding operation but before the diffusion cycle is carried out. In either case, the wafer may then be broken along the scribed lines to produce a plurality of independent transistors. The dicing step, which is more fully described in my U.S. Patent No. 3,112,850 consists of the selective removal or etching away of a portion of the semiconductor material which results from local vaporization caused by the impingement of a very intense beam of charged particles. This local vaporization leaves lines or grooves along which the chip will readily fracture. Dicing can be performed either before or after the attachment of leads to the emitter, collector and base areas. It is also understood that, since after scribing active areas are exposed, it may be desirable to cover the chips or resulting devices with a protective coating of low temperature oxide such as a lead-silicon oxide glass or a pyrolytically deposited layer of silicon dioxide. Also, in regards to FIGURE 8, it may be particularly desirable to slice the silicon wafers in such a manner that the [111] planes will be perpendicular to the surface of the slice and parallel to the simulated welds. In present planar technology, the [111] planes are parallel to the surface of the slice to promote uniform frontal diffusion. The reorientation of the [111] planes enhances frontal diffusion in devices fabricated in accordance with this invention.

As should now be apparent to those skilled in the art, this invention will result in the ability to produce high power transistors and semiconductor circuits such as functional electronic blocks by a technique which promises higher yield and, due to the elimination of one or more diffusion steps, a substantial saving in time. Since the depth of the spikes or impurity sources produced by the electron beam can be controlled precisely in conjunction with the thermal treatment, the base areas and profiles of the junction devices produced in accordance with this invention can also be precisely controlled. Further, since the surface configuration of the impurity sources can also be controlled by suitable programming of the beam, a very versatile technique is presented which will permit production of devices having large base areas. Adding to the versatility is the fact that the concentration of the impurity can also be controlled by adjusting the rate of feed of the material being added during the simulated welding steps and thus the characteristics of the resulting device can be accurately controlled. It will be noted, of course, that the material within the simulated weld spike is not necessarily monocrystalline in the resulting device. This does not, however, affect the performance since the simulated weld or degenerate regions are displaced from the junction areas. Thus, this invention presents the advantages that only one diffusion treatment is required to fabricate a transistor structure, and almost any geometry can be obtained by suitable programming of the electron beam. This invention also permits rapid formation of isolation moats for blocking diodes as required for semiconductor circuits on a single chip. Actually, as may be seen from FIGURE 8, the technique as described may inherently provide isolation moats, thus obviating the need for the time consuming isolation diffusion. To accomplish the foregoing it is, however, necessary to increase the time of a single diffusion step so that the $n$ impurity diffuses completely through the chip. In the area of semiconductor circuit fabrication, use of this invention obviates the need for multi oxide masking-etching steps. As a matter of fact, no oxidation treatment is required until after the device is completely fabricated, if even then. Another advantage arising from the use of this invention is that the base width of the resulting devices can be readily varied after the initial fabrication of the degenerate region by variation of the single diffusion treatment.

While a preferred embodiment of this invention has been shown and described, various modifications and substitutions may be made without deviating from the spirit and scope of this invention. Thus, this invention is described by the way of illustration rather than limitation and accordingly it is understood that this invention is to be limited only by the appended claims taken in view of the prior art.

I claim:

1. A method of fabricating a semiconductor device comprising:
directing an intense beam of charged particles at a discrete area on the surface of a body of host semiconductor material rich in an impurity of a first conductive type,
adjusting the power density of the beam of charged particles to a value that will permit the particles to penetrate into the host material and cause fusion thereof in a zone having a depth greater than its width,
deflecting the beam of charged particles across the body of host material in accordance with a desired pattern to form a fusion area having the desired surface pattern,
adding an impurity of a second conductive type to the fused zone until it becomes degenerate, and
heating the body of semiconductor material to cause second type impurity atoms to diffuse out of the fusion zone into the host material until a diffusion junction has been achieved in a limited region of the host material surrounding the fusion zone.

2. The method of claim 1 further comprising:
attaching a first lead to the body of host material at a point remote from the area into which the second type impurity atoms have been diffused, and
welding a second lead to the surface of the fusion area.

3. A method of fabricating a semiconductor device comprising:
fusing a first discrete zone of a body of host semiconductor material rich in an impurity of a first conductive type to a depth greater than the width of the fused zone,
adding an impurity of a second conductive type to the first fused zone until it becomes degenerate,
fusing a second discrete zone adjacent the first fused zone of the body host material to a depth greater than the width of the second fused zone,
adding the impurity of second conductive type to the second fused zone until it becomes degenerate, and
heating the body of host material in such a manner as to form, by diffusion of the second type impurity atoms out of the first and second degenerate fused zones into the host material,
adjacent diffusion junctions in limited regions surrounding the fused zones and separated from one another by a substantially parallel-sided narrow zone of host material extending from the surface of the host semiconductor material.

4. A method of fabricating semiconductor junction devices comprising:
fusing a first lineal discrete zone having a depth greater than its width within a body of host semiconductor material rich in an impurity of a first conductive type along a first line with a beam of charged particles,
adding an impurity of a second conductive type to the first lineal fused zone until it become degenerate,
fusing a second lineal discrete zone having a depth greater than its width within the body of host material along a second line adjacent to and parallel with the first lineal fused zone with a beam of charged particles,
adding an impurity of a second conductive type to the second fused zone until it becomes degenerate,
heating the body of host material to cause diffusion of the second type impurity atoms out of the first and second degenerate fused zones into the host material between them to form adjacent lineal diffusion junctions in limited regions surrounding the fused zones and separated from one another by a narrow zone of host material, and
dicing the body of host material along lines perpendicular to the lineal fused zones to form individual three element junction devices.

References Cited

UNITED STATES PATENTS

| | | | |
|---|---|---|---|
| 2,748,041 | 5/1956 | Leverenz. | |
| 2,778,926 | 1/1957 | Schneider. | |
| 2,787,564 | 4/1957 | Shockley | 148—1.5 |
| 2,823,148 | 2/1958 | Pankove | 148—178 |
| 2,894,862 | 7/1959 | Mueller | 148—178 X |
| 2,897,421 | 7/1959 | Kruper | 148—178 X |
| 3,080,481 | 3/1963 | Robinson. | |
| 3,179,542 | 4/1965 | Quinn | 148—177 |
| 3,242,014 | 3/1966 | Takagi | 148—1.5 |

WILLIAM I. BROOKS, *Primary Examiner.*